United States Patent
Xianyu et al.

(10) Patent No.: US 9,293,596 B2
(45) Date of Patent: Mar. 22, 2016

(54) GRAPHENE DEVICES AND METHODS OF MANUFACTURING THE SAME

(71) Applicant: Samsung Electronics Co., Ltd., Suwon-si, Gyeonggi-do (KR)

(72) Inventors: Wenxu Xianyu, Suwon-si (KR); Chang-youl Moon, Suwon-si (KR); Jeong-yub Lee, Seoul (KR); Chang-seung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/642,326

(22) Filed: Mar. 9, 2015

(65) Prior Publication Data

US 2015/0179814 A1    Jun. 25, 2015

Related U.S. Application Data

(62) Division of application No. 13/475,098, filed on May 18, 2012, now Pat. No. 8,999,812.

(30) Foreign Application Priority Data

Dec. 23, 2011 (KR) .................. 10-2011-0141706

(51) Int. Cl.
   *H01L 29/786* (2006.01)
   *H01L 29/66* (2006.01)
   *H01L 27/12* (2006.01)
   *H01L 29/16* (2006.01)

(52) U.S. Cl.
   CPC ...... *H01L 29/78684* (2013.01); *H01L 27/1266* (2013.01); *H01L 29/1606* (2013.01); *H01L 29/66045* (2013.01); *H01L 29/66742* (2013.01); *H01L 29/78603* (2013.01)

(58) Field of Classification Search
   CPC ....... H01L 29/786; H01L 29/66; H01L 29/16; H01L 29/78684; H01L 29/1606; H01L 29/66045; H01L 29/775; H01L 29/04; H01L 51/30; H01L 29/08
   USPC ........... 257/618, 785, 29, 40, 27, 52, 57, 223, 257/227, 291, 292, 439, 443, 655, 79, 82, 257/431, 451
   See application file for complete search history.

(56) References Cited

U.S. PATENT DOCUMENTS

2010/0320445 A1  12/2010  Ogihara et al.
2010/0323164 A1  12/2010  Ogihara et al.
(Continued)

FOREIGN PATENT DOCUMENTS

JP   2008205272 A   9/2008
JP   2011006265 A   1/2011
(Continued)

OTHER PUBLICATIONS

Yanjie Wang, et al., "Scalable Synthesis of Graphene on Patterned Ni and Transfer," *IEEE Transactions on Electron Devices*, vol. 57, No. 12 (Dec. 2010).

*Primary Examiner* — Chuong A Luu
(74) *Attorney, Agent, or Firm* — Harness, Dickey & Pierce

(57) ABSTRACT

A graphene device may include a channel layer including graphene, a first electrode and second electrode on a first region and second region of the channel layer, respectively, and a capping layer covering the channel layer and the first and second electrodes. A region of the channel layer between the first and second electrodes is exposed by an opening in the capping layer. A gate insulating layer may be on the capping layer to cover the region of the channel layer, and a gate may be on the gate insulating layer.

11 Claims, 18 Drawing Sheets

(56) References Cited

U.S. PATENT DOCUMENTS

2011/0114918 A1  5/2011  Lin et al.
2011/0316059 A1* 12/2011  Ahn et al. .................... 257/295

FOREIGN PATENT DOCUMENTS

| KR | 20100111999 A | 10/2010 |
|---|---|---|
| KR | 20110031864 A | 3/2011 |

\* cited by examiner

FIG. 5
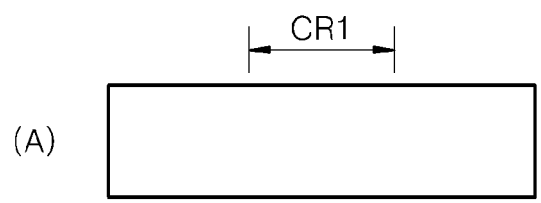
(A)
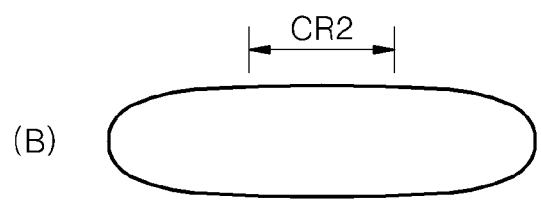
(B)
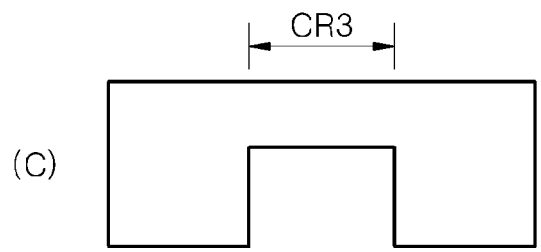
(C)
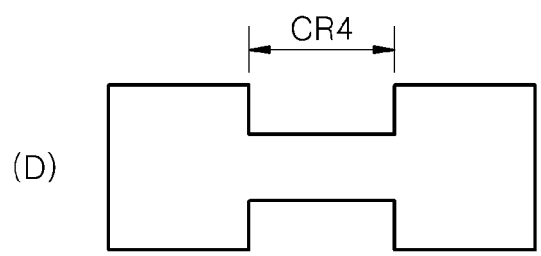
(D)

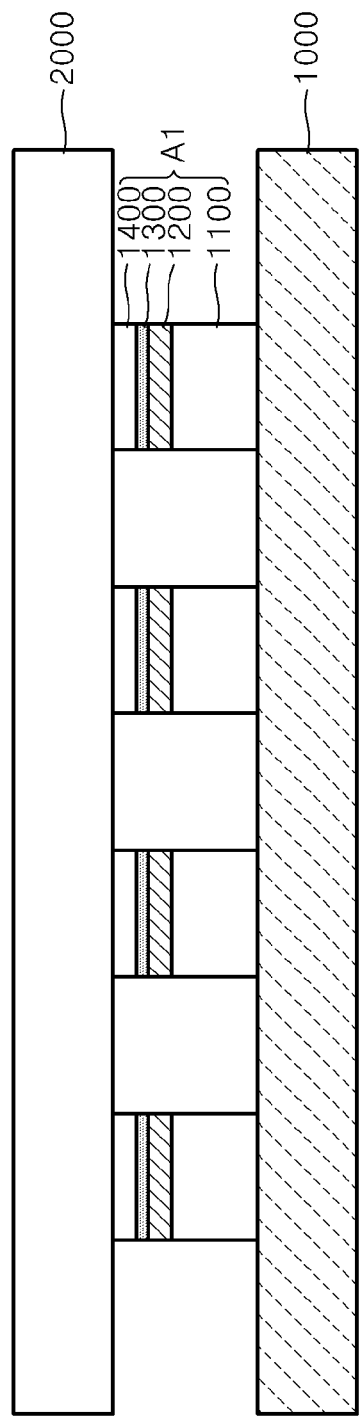

GRAPHENE DEVICES AND METHODS OF MANUFACTURING THE SAME

CROSS-REFERENCE TO RELATED APPLICATIONS

This application is a divisional application of U.S. application Ser. No. 13/475,098 filed May 18, 2012 now U.S. Pat. No. 8,999,812 which claims the benefit of Korean Patent Application No. 10-2011-0141706, filed on Dec. 23, 2011, in the Korean Intellectual Property Office, the disclosure of each of which is incorporated herein in its entirety by reference.

BACKGROUND

1. Field

Some example embodiments relate to graphene devices and methods of manufacturing the same.

2. Description of the Related Art

The integration degree and performance of silicon (Si)-based semiconductor devices have been improved. However, due to limitations in characteristics of Si materials and manufacturing processes, it is expected to be difficult to implement higher integration and higher performance Si-based semiconductor devices in the future.

Thus, research for next generation devices that overcome limitations in Si-based semiconductor devices has been carried out. For example, attempts have been made to manufacture a high-performance device by using a carbon-based nano structure, e.g., graphene. Graphene is a single-layer hexagonal structure consisting of carbon atoms, is stable chemically and structurally and exhibits desirable electrical/physical properties. For example, graphene has charge mobility of up to about $2\times10^5$ $cm^2/Vs$, which is more than a hundred times faster than that of silicon, and has current density of about $10^8$ $A/cm^2$, which is more than one hundred times greater than that of copper (Cu). Also, graphene may be transparent and may exhibit quantum characteristics at room temperature. Thus, graphene has drawn attention as a next-generation material that overcomes limitations in conventional devices.

However, it is difficult to manufacture a device using graphene since there are some restrictions in formation process of graphene. With the existing technologies, it is difficult to grow high-quality graphene on an insulating thin film. Thus, graphene should be formed on a metal thin film and then be transferred onto an insulator. However, the graphene may have some defects or be exposed to pollutants during the transfer of the graphene. Also, it is not easy to handle the graphene. Accordingly, it is restricted to manufacture or embody a device to which graphene is applied.

SUMMARY

Some example embodiments provide high-performance graphene devices and methods of manufacturing the same. For example, some example embodiments provide graphene devices in which damage to or pollution of graphene is prevented or reduced, and methods of manufacturing the same.

Additional aspects will be set forth in part in the description which follows and, in part, will be apparent from the description, or may be learned by practice of example embodiments.

According to an example embodiment, a graphene device includes a channel layer including graphene on a substrate, a source electrode on a first region of the channel layer, a drain electrode on a second region of the channel layer, a capping layer covering the channel layer, the source electrode, and the drain electrode, the capping layer including an opening exposing a channel region of the channel layer between the source electrode and the drain electrode, a gate insulating layer on the capping layer to cover the channel region, and a gate on the gate insulating layer between the source electrode and the drain electrode.

An insulating layer may be between the substrate and the channel layer. The insulating layer may be a patterned layer having a same shape as the channel layer. The source electrode and the drain electrode may be formed of a catalyst material for growing graphene. A passivation layer may be on the gate insulating layer to cover the gate.

First, second and third electrode pads may be on the passivation layer. The first electrode pad may be connected to the source electrode, the second electrode pad may be connected to the drain electrode, and the third electrode pad may be connected to the gate. The substrate may include at least one of a plastic substrate, a glass substrate, and a silicon substrate.

According to another example embodiment, a method of manufacturing a graphene device includes forming at least one stacked structure on a first substrate, adhering a second substrate onto the at least one stacked structure, and separating the first substrate by etching the sacrificial layer. The at least one stacked structure includes a sacrificial layer, a catalyst layer, and a graphene layer sequentially stacked thereon.

The forming at least one stacked structure may further include forming an insulating layer on the graphene layer. The forming at least one stacked structure may include forming a sacrificial material layer on the first substrate, forming a catalyst material layer on the sacrificial material layer, patterning the catalyst material layer and the sacrificial material layer, forming the graphene layer on the patterned catalyst material layer, and forming the insulating layer on the graphene layer.

The forming at least one stacked structure may include forming a sacrificial material layer on the first substrate, forming a catalyst material layer on the sacrificial material layer, forming a graphene material layer on the catalyst material layer, patterning the graphene material layer, the catalyst material layer, and the sacrificial material layer, and forming the insulating layer on the patterned graphene material layer.

The forming at least one stacked structure may include forming a sacrificial material layer on the first substrate, forming a catalyst material layer on the sacrificial material layer, forming a graphene material layer on the catalyst material layer, forming an insulating material layer on the graphene material layer, and patterning the insulating material layer, the graphene material layer, the catalyst material layer, and the sacrificial material layer.

A thickness of the sacrificial layer may be greater than a thickness of the insulating layer. The sacrificial layer may include at least one of titanium tungsten (TiW), molybdenum (Mo), and silicon oxide ($SiO_2$). The second substrate may include at least one of a plastic substrate, a glass substrate, and a silicon substrate. The graphene device may be a transistor, and the graphene layer may be used as a channel layer of the transistor.

The graphene device may include a source electrode contacting a first region of the graphene layer and a drain electrode contacting a second region of the graphene layer, and at least a portion of the source electrode and the drain electrode is formed from the catalyst layer.

A capping layer may be formed to cover the at least one stacked structure on the second substrate, and the capping layer and the catalyst layer may be patterned to form a source electrode and a drain electrode from the catalyst layer and expose a channel region of the graphene layer between the source electrode and the drain electrode.

A gate insulating layer may be formed on the capping layer to cover the channel region of the graphene layer between the source electrode and the drain electrode, and a gate may be formed on the gate insulating layer. The forming at least one stacked structure may form a plurality of stacked structures. The separating the first substrate may include injecting an etching solution between the plurality of the stacked structures. The first substrate may be patterned to form at least one trench therein before the separating.

According to another example embodiment, a method of manufacturing a graphene device includes preparing a stacked pattern on a substrate, forming a capping layer to cover the stacked pattern, patterning the capping layer and the conductive layer to form a source electrode and a drain electrode from the conductive layer and expose a channel region of the channel layer between the source electrode and the drain electrode, forming a gate insulating layer on the capping layer to cover the channel region of the channel layer between the source electrode and the drain electrode, and forming a gate on the gate insulating layer. The stacked pattern may have a channel layer including graphene and a conductive layer sequentially stacked thereon.

The preparing a stacked pattern may further include forming an insulating layer between the substrate and the channel layer. The insulating layer may be a patterned layer having a same shape as the channel layer. The conductive layer may be formed of a catalyst material for growing graphene. The substrate may include one of a plastic substrate, a glass substrate, and a silicon substrate. The stacked pattern may be grown on another substrate and transferred to the substrate by wafer-to-wafer bonding.

BRIEF DESCRIPTION OF THE DRAWINGS

These and/or other aspects will become apparent and more readily appreciated from the following description of example embodiments, taken in conjunction with the accompanying drawings of which:

FIG. 5 is a plan view illustrating various planar structures of a channel layer included in a graphene device, according to an example embodiment;

FIG. 13 is a cross-sectional view taken along a line I-I' of FIG. 12D;

DETAILED DESCRIPTION

Figure 1:
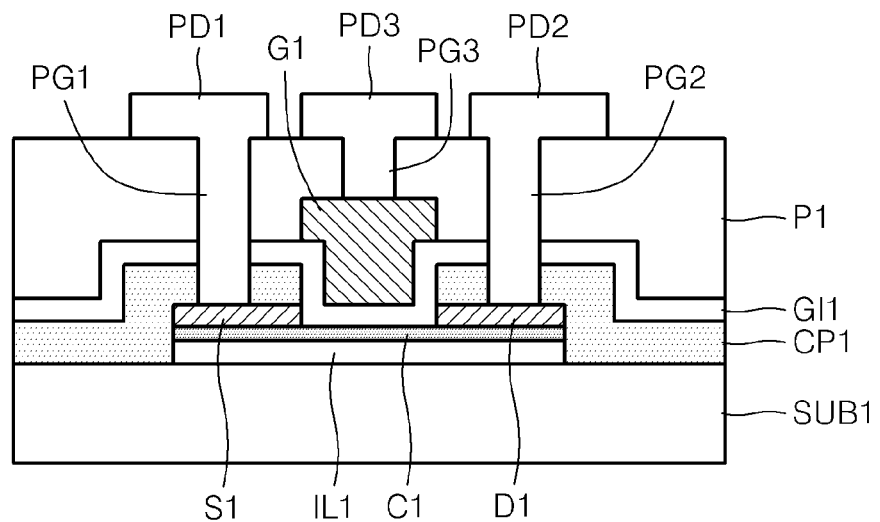
FIGS. 1 to 4 are cross-sectional views of graphene devices according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, graphene devices and methods of manufacturing the same according to some example embodiments will be described in detail with reference to the accompanying drawings. In the drawings, the width and thickness of layers and regions may be exaggerated for clarity. The same reference numerals represent the same elements throughout the drawings.

FIG. 1 is a cross-sectional view of a graphene device according to an example embodiment. In the current example embodiment, the graphene device is a transistor that uses graphene as a channel layer, e.g., a graphene transistor.

Referring to FIG. 1, a channel layer C1 may be disposed a substrate SUB1. The substrate SUB1 may be a flexible or rigid substrate, and may be transparent or opaque. For example, the substrate SUB1 may be a plastic substrate, a glass substrate, or a silicon substrate, but the material of the substrate SUB1 is not limited thereto. As another example, the substrate SUB1 may be a sapphire substrate or a quartz substrate. The channel layer C1 may be a graphene layer. In this case, the channel layer C1 may include about one to about ten layers of graphene. In other words, the channel layer C1 may be formed of a single layer of graphene or a stacked structure of a plurality of graphenes less than about ten layers.

An insulating layer IL1 may be disposed between the substrate SUB1 and the channel layer C1. The insulating layer IL1 may be a patterned layer having a shape that is the same as or similar to that of the channel layer C1. That is, from a top view, the insulating layer IL1 and the channel layer C1 may have the same or similar shape. Thus, the insulating layer IL1 and the channel layer C1 may form a stacked pattern. The insulating layer IL1 may be formed of, for example, a silicon (Si) oxide, an aluminum (Al) oxide, or a hafnium (Hf) oxide, but is not limited thereto.

The insulating layer IL1 may have a thickness from about several nm to several hundreds nm. Although not shown, a semiconductor layer formed of a semiconductor material, such as silicon (Si) or germanium (Ge), may be disposed between the insulating layer IL1 and the channel layer C1. Also, although now shown, a given (or, alternatively) predetermined conductive layer, e.g., a metal layer, may further be disposed between the insulating layer IL1 and the substrate SUB1. The semiconductor layer and the conductive layer may be patterned layers having a shape that is the same as or similar to those of the channel layer C1 and the insulating layer IL1, but are not limited thereto.

A source electrode S1 and a drain electrode D1 may be disposed to contact a first region and second region of the channel layer C1, respectively. The source electrode S1 may be disposed on one end of the channel layer C1 and the drain electrode D1 may be disposed on another end of the channel layer C1. A region of the channel layer C1 between the source electrode S1 and the drain electrode D1 may be referred to as a rce electrode. The channel region may be a center region of the channel layer C1. The source electrode S1 and the drain electrode D1 may be formed of, for example, a catalyst material for growing graphene. The catalyst material may include at least one metal, for example, copper (Cu), nickel (Ni), cobalt (Co), platinum (Pt), ruthenium (Ru), and/or a mixture thereof.

Each of the source electrode S1 and the drain electrode D1 may be a single or multi-layered structure. A material of the source electrode S1 and the drain electrode D1 is not limited to these materials, and may vary. In other words, the source electrode S1 and the drain electrode D1 may be formed of any one of various conductive materials used in a conventional semiconductor device.

A capping layer CP1 may be disposed on the substrate SUB1 to cover the channel layer C1, the source electrode S1, and the drain electrode D1. The capping layer CP1 may have an opening (e.g., aperture) exposing the region (the channel region) of the channel layer C1 between the source electrode S1 and the drain electrode D1. The capping layer CP1 may be formed of an insulating material, e.g., a Si oxide, a Si nitride, or a Si oxynitride. The capping layer CP1 may firmly fix the channel layer C1, the source electrode S1, and the drain electrode D1 onto the substrate SUB1. Also, the capping layer CP1 may be required in connection with a manufacturing process of the graphene device of the current example embodiment.

A gate insulating layer Gl1 may be disposed on the capping layer CP1 to cover the region of the channel layer C1 (the channel region) between the source electrode S1 and the drain electrode D1. The gate insulating layer Gl1 may be formed conformally to upper surfaces of the capping layer CP1 and the channel region. The gate insulating layer Gl1 may have a thickness of about several nm to about several hundreds nm. The gate insulating layer Gl1 may be formed of a Si oxide, a Si nitride, a Si oxynitride, a high-k material having a dielectric constant higher than that of the Si nitride, e.g., an Al oxide, an Hf oxide, or a Zr oxide, or an organic material, e.g., polymer. Otherwise, the gate insulating layer Gl1 may be formed of at least two materials from among the above materials.

A gate G1 may be disposed on the gate insulating layer Gl1. The gate G1 may be disposed above the region of the channel layer C1 between the source electrode S1 and the drain electrode D1, e.g., the channel region. The gate G1 may be formed of any one of various conductive materials, e.g., metal or a conductive oxide, that are used in a conventional semiconductor device. A passivation layer P1 may be disposed on the gate insulating layer Gl1 to cover the gate G1. The passivation layer P1 may be, for example, a Si oxide layer, a Si oxynitride layer, a Si nitride layer, an organic layer, or a stacked structure of at least two layers from among these layers.

First to third electrode pads PD1 to PD3 may be disposed on the passivation layer P1. The first electrode pad PD1 may be connected to the source electrode S1, the second electrode pad PD2 may be connected to the drain electrode D1, and the third electrode pad PD3 may be connected to the gate G1. The first electrode pad PD1 may be connected to the source electrode S1 via a first contact plug PG1. The second electrode pad PD2 may be connected to the drain electrode D1 via a second contact plug PG2. The third electrode pad PD3 may be connected to the gate G1 via a third contact plug PG3. The first and second contact plugs PG1 and PG2 may be formed to pass through the passivation layer P1, the gate insulating layer Gl1, and the capping layer CP1. The third contact plug PG3 may be formed to pass through the passivation layer P1.

The structure of the substrate SUB1 of FIG. 1 may be modified in various ways. For example, a surface of the substrate SUB1 may be coated with a coating layer, as illustrated in FIGS. 2 and 3.

Figure 2:
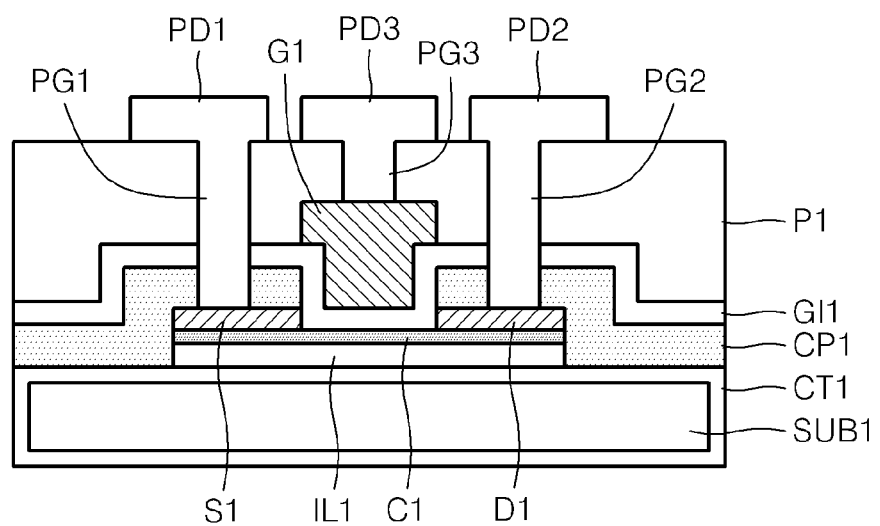

Referring to FIG. 2, a substrate SUB1 may be wrapped by a coating layer CT1. In other words, the coating layer CT1 may cover upper, lower, and side surfaces of the substrate SUB1. The coating layer CT1 may be formed of an insulating material, such as a Si oxide, a Si nitride, or an Al oxide, for example. A graphene device, e.g., a graphene transistor, as described above with reference to FIG. 1 may be disposed on the coating layer CT1.

Figure 3:
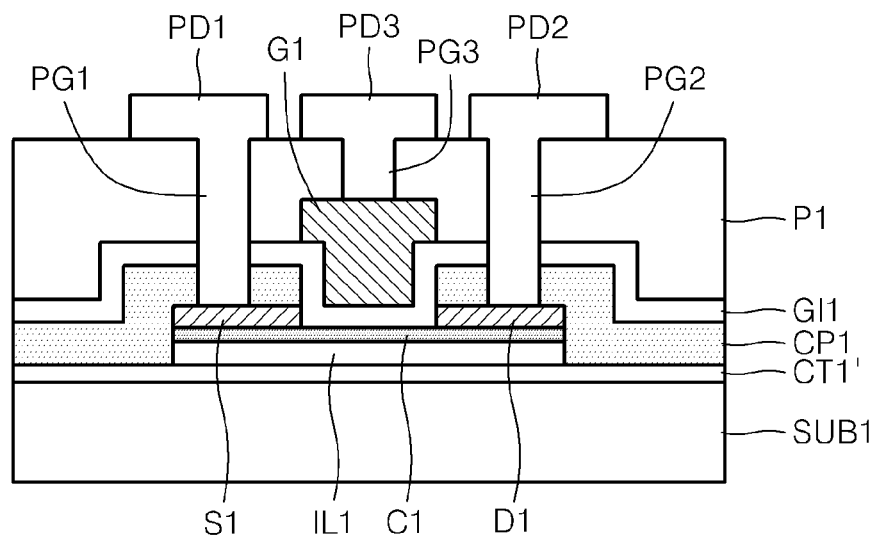

Referring to FIG. 3, a coating layer CT1' may be disposed only on an upper surface of the substrate SUB1, and the graphene device (graphene transistor) as described above with reference to FIG. 1 may be disposed on the coating layer coating layer CT1'. A material of the coating layer CT1' may be the same as that of the coating layer CT1 of FIG. 2. Although not shown, another coating layer may further be disposed on a lower surface of the substrate SUB1 of FIG. 3.

In FIGS. 1 to 3, the structure of the graphene device (graphene transistor) disposed on the substrate SUB1 or the coating layer CT1 or CT1' may also be modified. For example, the structure of the capping layer CP1 of FIG. 1 may be modified as illustrated in FIG. 4.

Figure 4:
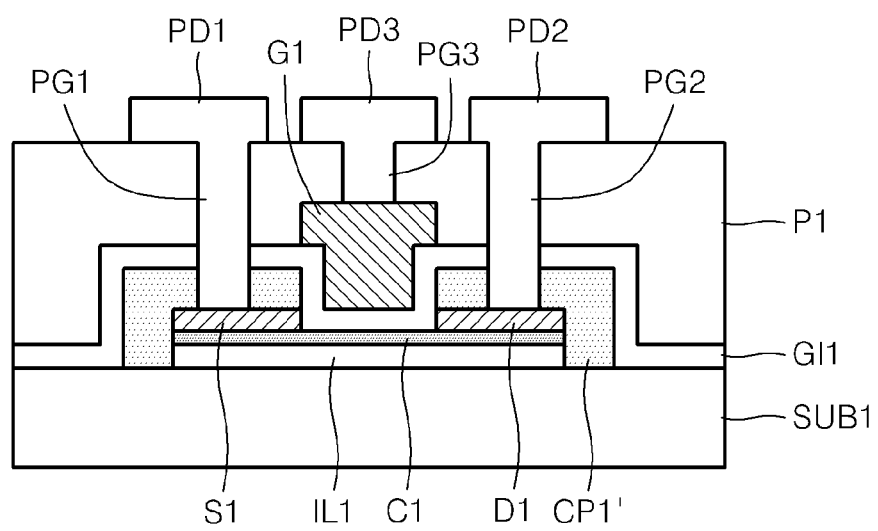

Referring to FIG. 4, a capping layer CP1' may cover a channel layer C1, a source electrode S1, and a drain electrode D1, and may have an opening exposing a region of a channel layer C1 (channel region) between the source electrode S1 and the drain electrode D1. The capping layer CP1' may cover regions of the substrate SUB1 around the channel layer C1 but may not cover the outer regions of the substrate SUB1. In this regard, the capping layer CP1' of FIG. 4 is different from the capping layer CP1 of FIG. 1. The capping layer CP1 of FIG. 1 may be as advantageous as the capping layer CP1' of FIG. 4 in view of their functions to fix the channel layer C1, the source electrode S1, and the drain electrode D1 onto the substrate SUB1.

In FIGS. 1 to 4, the channel layer C1 may have various planar structures. For example, the channel layer C1 may have one of various planar structures illustrated in FIG. 5. The channel layer C1 of FIGS. 1 to 4 may have a rectangular shape as shown in FIG. 5(A), an oval shape (or rice grain shape) as shown in FIG. 5(B), a bent shape as shown in FIG. 5(C), or a dumbbell shape as shown in FIG. 5(D). In FIG. 5(C) and (D), both ends of the channel layer may be wider than a center region thereof. In FIG. 5(A) to (D), a center region of the channel layer may be a channel region CR1 to CR4, and a source electrode (not shown) and a drain electrode (not shown) may be disposed on the channel layer C1 at both sides of the channel regions. However, the planar structures of the channel layer illustrated in FIG. 5 are just illustrative examples, and may vary.

Figure 6A:
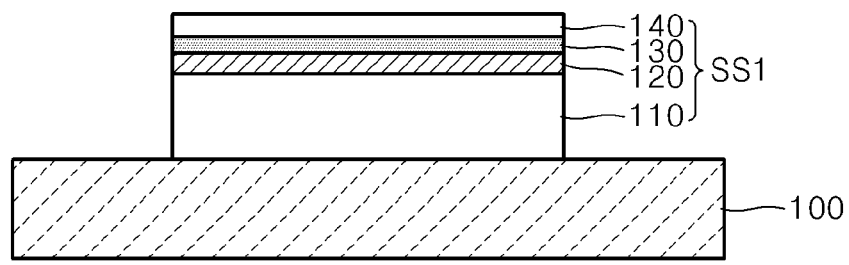
FIGS. 6A to 6J are cross-sectional views illustrating a method of manufacturing a graphene device, according to an example embodiment.

FIGS. 6A to 6J are cross-sectional views illustrating a method of manufacturing a graphene device, according to an example embodiment. Referring to FIG. 6A, a stacked structure SS1 in which a sacrificial layer 110, a catalyst layer 120, a graphene layer 130, and an insulating layer 140 are sequentially stacked may be formed on a first substrate 100. The first substrate 100 may be a silicon substrate but may be another substrate, e.g., a quartz substrate or a sapphire substrate, in some instances.

The sacrificial layer 110 is to be removed by etching in a subsequent process, and may be formed of a material that may be etched faster than the catalyst layer 120 or the graphene layer 130. In other words, the sacrificial layer 110 may be formed of a material having etch selectivity with respect to the other layers 120 to 140 of the stacked structure SS1. For example, the sacrificial layer 110 may be formed of a metallic material, e.g., titanium tungsten (TiW) or molybdenum (Mo), or a dielectric material, e.g., silicon oxide ($SiO_2$). The sacrificial layer 110 may have a thickness of about several hundreds nm to about several μm. In If the sacrificial layer 110 has a relatively thick thickness of about several hundreds nm to several μm, the subsequent process of removing the sacrificial layer 110 may be more easily performed, as will be described in detail later.

The catalyst layer 120 may be formed of a catalyst material for forming the graphene layer 130. The catalyst material may be a conductive material. For example, the catalyst layer 120 may be formed of a metal selected from the group consisting of Cu, Ni, Co, Pt, Ru, and the like, or a mixture thereof. The catalyst layer 120 may have a single or multi-layered structure. The catalyst layer 120 may be formed by using any one of various methods, e.g., plating, evaporation, sputtering, chemical vapor deposition (CVD), atomic layer deposition (ALD), or the like. The catalyst layer 120 may be formed to have a thickness of about 100 nm to about 500 nm, but the thickness may be more than about 500 nm in some instances.

The graphene layer 130 may be formed by CVD or pyrolysis. The graphene layer 130 may be an epitaxial graphene layer. In order to form the graphene layer 130, a high temperature process which is performed at about 700° C. to about 1100° C. may be required. Thus, the first substrate 100 may be formed of a heat-resistant material for enduring the high temperature process. In this regard, a silicon substrate may be used as the first substrate 100. However, the other types of substrates that are resistant to the high temperature process may be used as the first substrate 100. For example, a quartz substrate or a sapphire substrate may be used as the first substrate 100.

The insulating layer 140 may have a function to protect the graphene layer 130. Also, the insulating layer 140 may be used to improve the adhesion force between the stacked structure SS1 and a second substrate 200 of FIG. 6B which will be formed in a subsequent process. The insulating layer 140 may be, for example, a Si oxide, an Al oxide, an Hf oxide, or the like, but is not limited thereto. The insulating layer 140 may be formed by a method that does not damage the graphene layer 130, for example, evaporation. The evaporation may be electron-beam evaporation. Otherwise, the insulating layer 140 may be formed by oxidizing a metal layer. For example, an aluminum (Al) layer may be formed and oxidized to form the insulating layer 140 that is an Al oxide. The Al layer may be formed by evaporation. The thickness of the insulating layer 140 may be less than that of the sacrificial layer 110. For example, the insulating layer 140 may have a thickness of about several nm to about several hundreds nm.

Although not shown, a semiconductor layer may be formed between the graphene layer 130 and the insulating layer 140. The semiconductor layer may be formed of a semiconductor material, such as silicon (Si) or germanium (Ge). Also, although not shown, a conductive layer, e.g., a metal layer, may be further formed on the insulating layer 140. The semiconductor layer and the conductive layer may be patterned layers having a shape that is the same as or similar to that of the graphene layer 130 and the insulating layer 140.

The stacked structure SS1 of FIG. 6A may be formed by various ways, as will be described in detail with reference to FIGS. 7A to 10B.

Figure 7A:
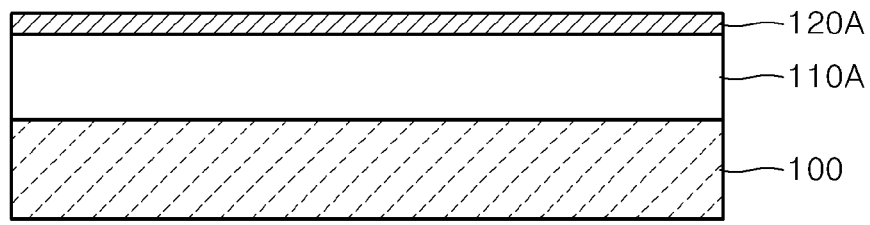
FIGS. 7A to 7D are cross-sectional views illustrating a method of forming a stacked structure of FIG. 6A, according to an example embodiment.

FIGS. 7A to 7D are cross-sectional views illustrating a method of forming the stacked structure SS1 of FIG. 6A, according to an example embodiment. Referring to FIG. 7A, a sacrificial material layer 110A may be formed on an entire upper surface of a first substrate 100, and a catalyst material layer 120A may be formed on the sacrificial material layer 110A. Methods and materials used to form the sacrificial material layer 110A and the catalyst material layer 120A may be respectively the same as those used to form the sacrificial layer 110 and the catalyst layer 120 described above with reference to FIG. 6A.

Figure 7B:
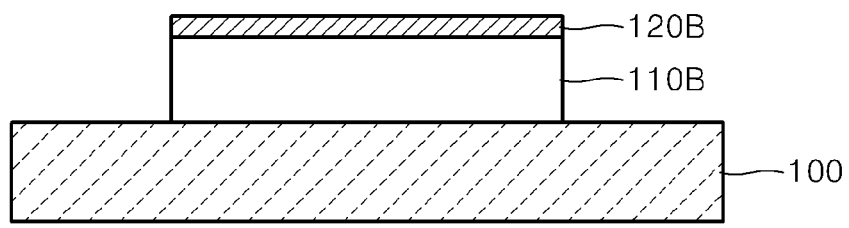

Referring to FIG. 7B, the catalyst material layer 120A and the sacrificial material layer 110A may be patterned. The patterned sacrificial material layer 110B and catalyst material layer 120B may be respectively the same as the sacrificial layer 110 and the catalyst layer 120 of FIG. 6A. The patterned sacrificial material layer 110B and catalyst material layer 120B of FIG. 7B will now be referred to as the sacrificial layer 110 and the catalyst layer 120, respectively. The patterning of FIG. 7B may be performed by dry etching or wet etching.

Figure 7C:
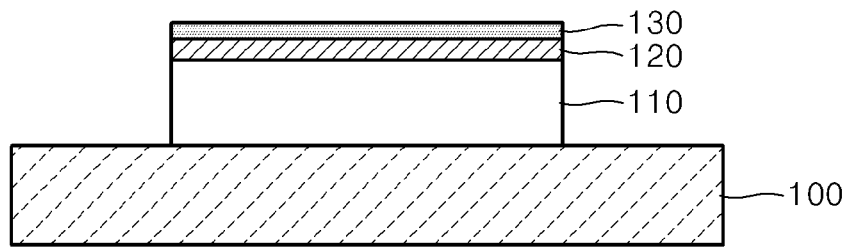

Referring to FIG. 7C, a graphene layer 130 may be formed on the catalyst layer 120. The graphene layer 130 may be selectively grown only on the catalyst layer 120.

Figure 7D:
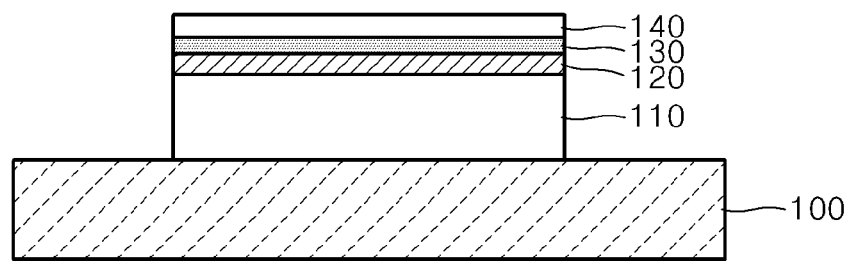
Figure 8:
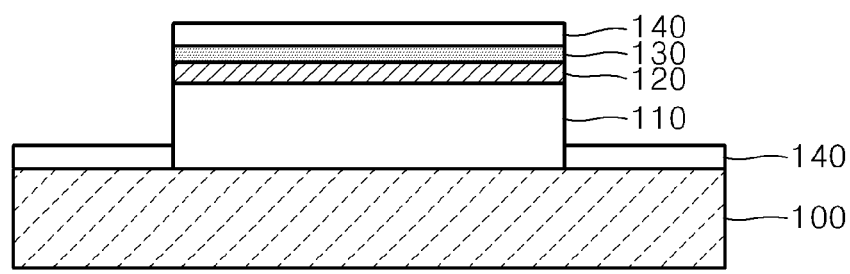
FIG. 8 is a cross-sectional view of a modified example of the stacked structure illustrated in FIG. 7D, according to an example embodiment.

Referring to FIG. 7D, an insulating layer 140 may be formed on the graphene layer 130. The insulating layer 140 may be formed by an evaporation method as described above. The evaporation method may be a physical vapor deposition (PVD) process, and thus, a material of the insulating layer 140 may be deposited on an exposed upper surface of the first substrate 100. That is, as illustrated in FIG. 8, the insulating layer 140 may be formed not only on the graphene layer 130 but also on the exposed upper surface of the first substrate 100. However, the material of the insulating layer 140 may not be applied on a most part of side surfaces of the sacrificial layer 110 and side surfaces of the catalyst layer 120 and the graphene layer 130. Although the insulating layer 140 is formed on the exposed upper surface of the first substrate 100 as illustrated in FIG. 8, the sacrificial layer 110 is formed to have a relatively thick thickness and most of the sacrificial layer 110 is exposed. Thus, the sacrificial layer 110 may be more easily etched in a subsequent process.

Figure 9A:
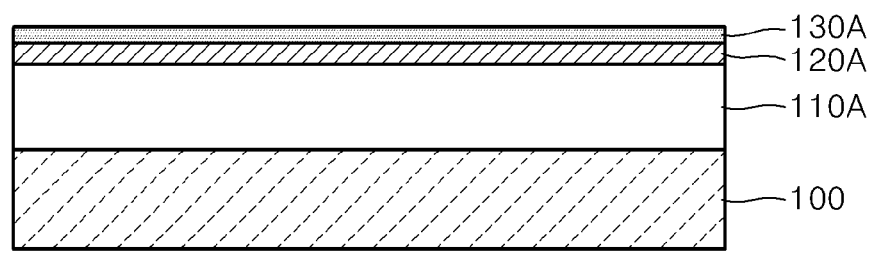
FIGS. 9A to 9C are cross-sectional views illustrating a method of forming the stacked structure of FIG. 6A, according to another example embodiment.
Figure 9B:
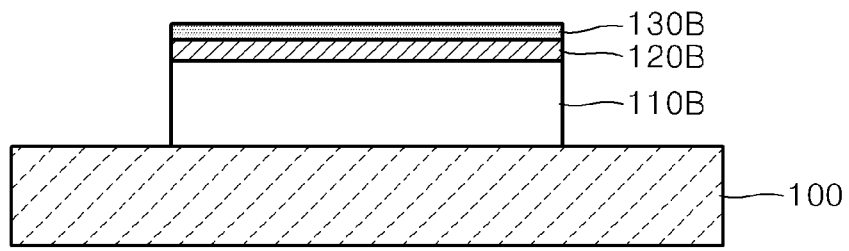
Figure 9C:
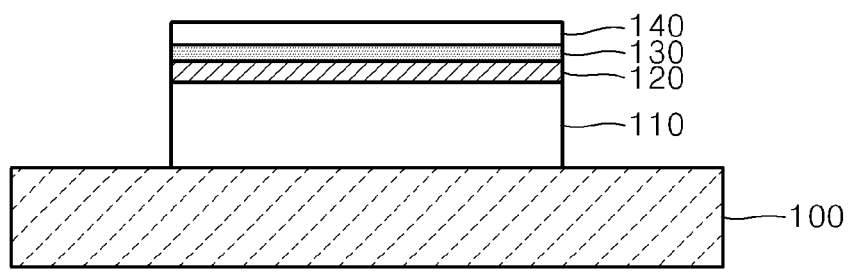

FIGS. 9A to 9C are cross-sectional views illustrating a method of forming the stacked structure SS1 of FIG. 6A, according to another example embodiment. Referring to FIG. 9A, a sacrificial material layer 110A, a catalyst material layer 120A, and a graphene material layer 130A may be sequentially formed on a first substrate 100. Methods and materials used to form the sacrificial material layer 110A, the catalyst material layer 120A, and the graphene material layer 130A may be respectively the same as those used to form the sacrificial layer 110, the catalyst layer 120, and the graphene layer 130 described above with reference to FIG. 6A.

Referring to FIG. 9B, the graphene material layer 130A, the catalyst material layer 120A, and the sacrificial material layer 110A may be patterned. The patterned sacrificial material layer 110B, catalyst material layer 120B, and graphene material layer 130B may be the same as the sacrificial layer 110, the catalyst layer 120, and the graphene layer 130 of FIG. 6A, respectively. The patterned sacrificial material layer 110B, catalyst material layer 120B, and graphene material layer 130B of FIG. 9B will now be referred to as the sacrificial layer 110, the catalyst layer 120, and the graphene layer 130, respectively. The patterning of FIG. 9B may be performed by dry etching or wet etching.

Referring to FIG. 9C, an insulating layer 140 may be formed on the graphene layer 130. The insulating layer 140 may be formed not only on the graphene layer 130 but also on an exposed upper surface of the first substrate 100, as described above with reference to FIG. 8.

Figure 10A:
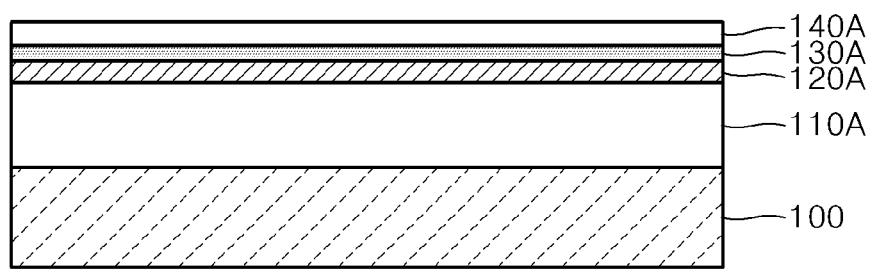
FIGS. 10A and 10B are cross-sectional views illustrating a method of forming the stacked structure of FIG. 6A, according to another example embodiment.
Figure 10B:
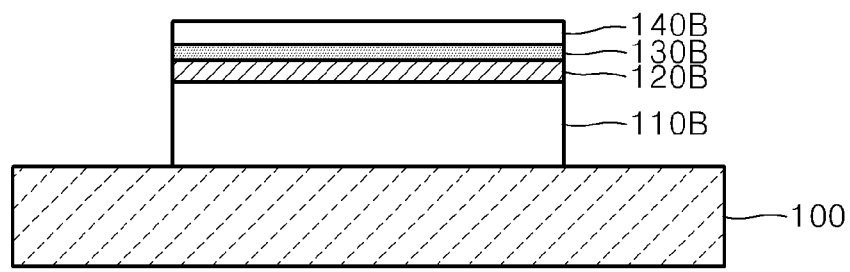

FIGS. 10A and 10B are cross-sectional views illustrating a method of forming the stacked structure SS1 of FIG. 6A, according to another example embodiment. Referring to FIG. 10A, a sacrificial material layer 110A, a catalyst material layer 120A, a graphene material layer 130A, and an insulating material layer 140A may be sequentially formed on a first substrate 100.

Referring to FIG. 10B, the insulating material layer 140A, the graphene material layer 130A, the catalyst material layer 120A, and the sacrificial material layer 110A may be patterned. The patterned sacrificial material layer 110B, catalyst material layer 120B, graphene material layer 130B, and insulating material layer 140B may be the same as the sacrificial layer 110, the catalyst layer 120, the graphene layer 130, and the insulating layer 140 of FIG. 6A, respectively. The patterning of FIG. 10B may be performed by dry etching or wet etching.

As described above with reference to FIGS. 7A to 10B, the stacked structure SS1 of FIG. 6A may be formed in various ways. Also, the stacked structure SS1 of FIG. 6A may be formed in other various ways. In some cases, the insulating layer 140 (or 140A) may not be formed on the graphene layer 130 (or 130A) in the methods described above with reference to FIGS. 7A to 10B. In other words, the stacked structure SS1 of FIG. 6A may not include the insulating layer 140.

Referring back to FIG. 6B, the second substrate 200 may be adhered to the stacked structure SS1. The second substrate 200 may be a flexible or rigid substrate or may be transparent or opaque. For example, the second substrate 200 may be a plastic substrate, a glass substrate, a silicon substrate, or the like. However, the second substrate 200 is not limited thereto and any of various types of substrates may be used as the second substrate 200. For example, the second substrate 200 may be a sapphire substrate or a quartz substrate. The type of the second substrate 200 may be selected regardless of a process temperature, and thus various substrates may be used as the second substrate 200. The second substrate 200 may correspond to the substrate SUB1 of FIG. 1.

Although not shown, a given (or, alternatively) predetermined coating layer may be formed on the second substrate 200 and then be adhered to the stacked structure SS1. The coating layer may be formed to wrap the second substrate 200 or may be formed only on a lower surface of the second substrate 200, e.g., a surface of the second substrate 200 contacting the stacked structure SS1. The coating layer may correspond to one of the coating layers CT1 and CT1' of FIGS. 2 and 3. An interface between the second substrate 200 and the stacked structure SS1 may be a Si/SiO$_2$ interface, a SiO$_2$/SiO$_2$ interface, a glass/SiO$_2$ interface, or an AlO$_x$/SiO$_2$ interface, according to the material of the second substrate 200 or a layer coated (the coating layer) onto the second substrate 200 and the material of the insulating layer 140. If the stacked structure SS1 does not include the insulating layer 140, the graphene layer 130 may be formed on the top of the stacked structure SS1, and either the second substrate 200 or the layer (the coating layer) coated onto the second substrate 200 may contact the graphene layer 130.

Figure 6B:
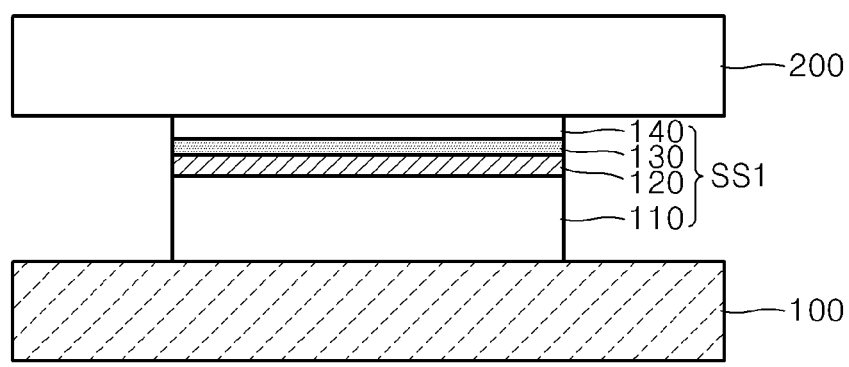
Figure 6C:
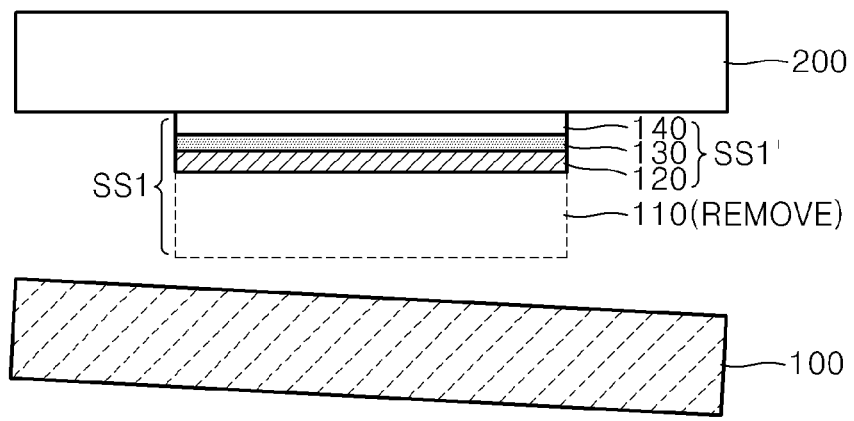

Referring to FIG. 6C, the sacrificial layer 110 may be etched to separate/remove the first substrate 100 from the stacked structure SS1. The sacrificial layer 110 may be selectively etched by using an etching solution (not shown) having high etch selectivity with respect to the sacrificial layer 110. If the sacrificial layer 110 is formed of titanium tungsten (TiW), the sacrificial layer 110 may be selectively etched by using, for example, an etching solution containing H$_2$O$_2$. If the sacrificial layer 110 is formed of molybdenum (Mo), the sacrificial layer 110 may be selectively etched by using, for example, an etching solution containing $H_3PO_4$. If the sacrificial layer 110 is formed of a Si oxide, the sacrificial layer 110 may be selectively etched by using, for example, an etching solution containing HF.

The sacrificial layer 110 may be etched by dipping at least the first substrate 100 and the sacrificial layer 110 of the stacked structure SS1 into such an etching solution. Otherwise, the sacrificial layer 110 may be etched by dipping all the first substrate 100, the stacked structure SS1, and the second substrate 200 into the etching solution. Since the thickness of the sacrificial layer 110 is relatively thick, the sacrificial layer 110 may be more easily etched by the etching solution. More specifically, to facilitate the etching of the sacrificial layer 110, the sacrificial layer 110 should have a relatively large surface area that contacts the etching solution, and the etching solution and by-products of the etching process should be more easily discharged/exhausted.

Thus, if the thickness of the sacrificial layer 110 is thicker than those of the other layers 120 to 140, the etching of the sacrificial layer 110 may be facilitated. Even if the insulating layer 140 is formed of the same material as the sacrificial layer 110, the speed of etching the insulating layer 140 may be slower than that of etching the sacrificial layer 110 when the insulating layer 140 is thinner than the sacrificial layer 110. Thus, even if the same material is used to form the insulating layer 140 and the sacrificial layer 110, the sacrificial layer 110 may be selectively etched, as illustrated in FIG. 11.

Figure 11:
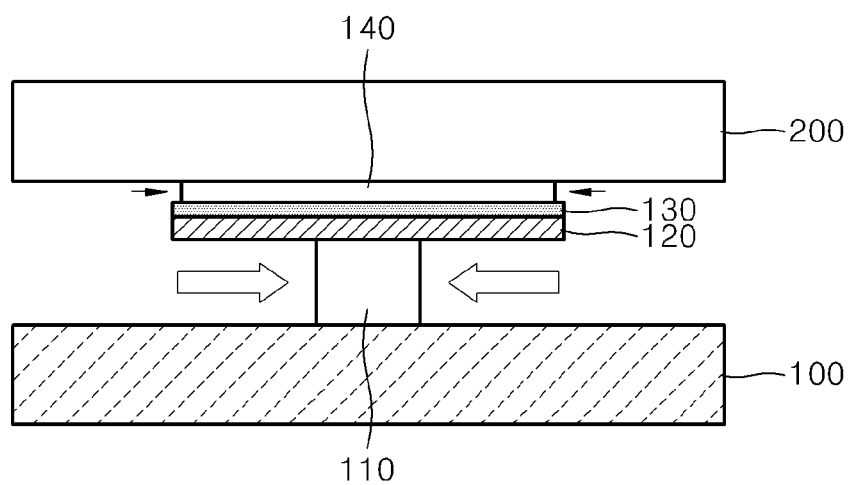
FIG. 11 is a cross-sectional view illustrating a process of etching a sacrificial layer to manufacture a graphene device, according to an example embodiment.

FIG. 11 illustrates that the etching speed of the insulating layer 140 and the etching speed of the sacrificial layer 110 are different from each other when the insulating layer 140 and the sacrificial layer 110 are formed of the same (or similar) material. Since the insulating layer 140 is thinner than the sacrificial layer 110, the etching speed of the insulating layer 140 may be slower than that of the sacrificial layer 110. Thus, the insulating layer 140 may be hardly etched and only the sacrificial layer 110 may be selectively etched.

Figure 6D:
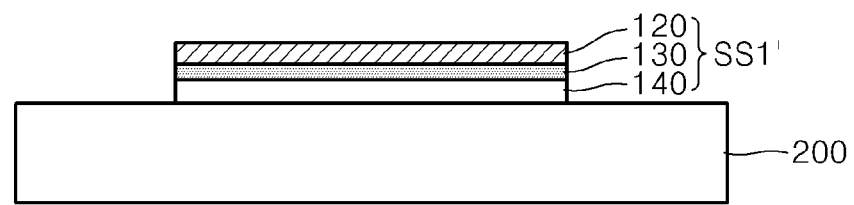

Referring back to FIG. 6C, the resultant structure that remains after the sacrificial layer 110 is removed from the stacked structure SS1 may be referred to as a remaining stacked structure SS1'. The second substrate 200 onto which the remaining stacked structure SS1' is adhered may be turned upside down, as illustrated in FIG. 6D. In FIG. 6D, a stacked structure in which the insulating layer 140, the graphene layer 130, and the catalyst layer 120 are sequentially stacked, e.g., the remaining stacked structure SS1', may be disposed on the second substrate 200. As illustrated in FIGS. 6A to 6C, in the current example embodiment, substrate-to-substrate bonding and a separating/splitting technique may be used to transfer the stacked structure SS1 from the first substrate 100 to the second substrate 200. To separate the stacked structure SS1 from the first substrate 100, a part of the stacked structure SS1, e.g., the sacrificial layer 110, may be etched.

Figure 6E:
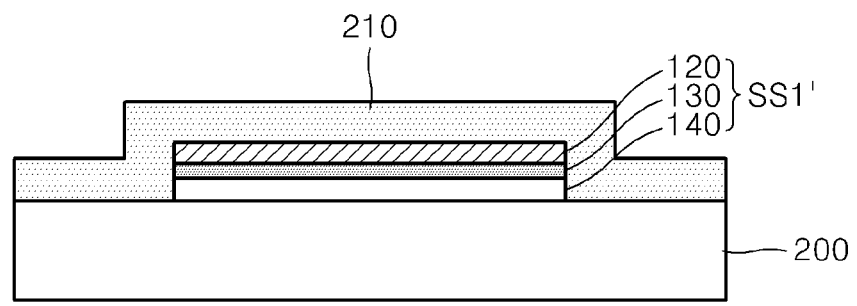

Referring to FIG. 6E, a capping layer 210 may be formed to cover the remaining stacked structure SS1y on the second substrate 200. The capping layer 210 may be formed of an insulating material, such as a Si oxide, a Si nitride, or a Si oxynitride, and by using electron-beam evaporation method, for example.

Figure 6F:
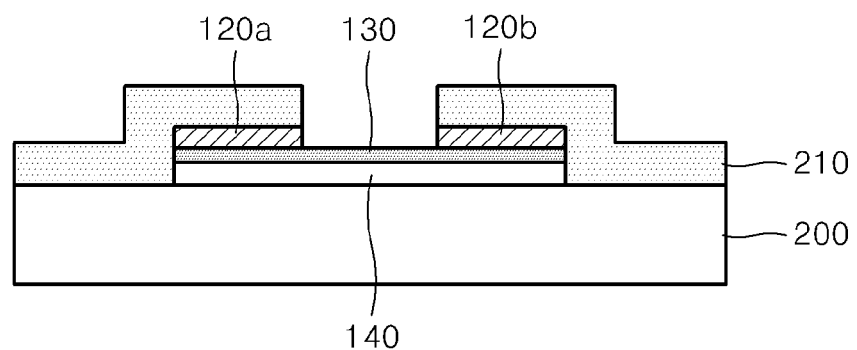

Referring to FIG. 6F, a portion of the capping layer 210 and a portion of the catalyst layer 120 may be etched by using one mask pattern (not shown). As a result, a source electrode 120a and a drain electrode 120b may be formed from the catalyst layer 120, and a region of the graphene layer 130 may be exposed between the source electrode 120a and the drain electrode 120b. The exposed region of the graphene layer 130 between the source electrode 120a and the drain electrode 120b may be referred to as a 'channel region'. The position of the channel region may be automatically determined by the positions of the source electrode 120a and the drain electrode 120b.

Thus, the source electrode 120a and the drain electrode 120b may be self-aligned with respect to the channel region CR. The capping layer 210 may firmly fix the graphene layer 130, the source electrode 120a, and the drain electrode 120b onto the second substrate 200. The capping layer 210 may prevent or inhibit the graphene layer 130 from peeling off from or being separated from the second substrate 200 during the manufacture of the graphene device. The shape of the capping layer 210 illustrated in FIG. 6F is an example, and may vary. For example, the shape of the capping layer 210 may be similar to that of the capping layer CP1' of FIG. 4.

Figure 6G:
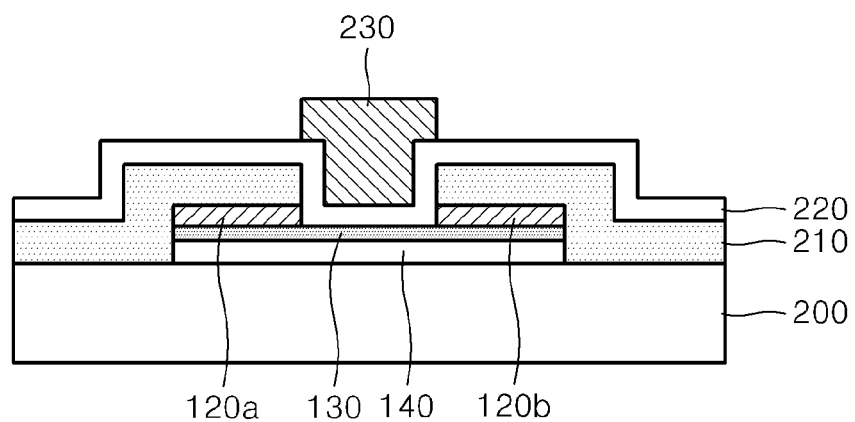

Referring to FIG. 6G, a gate insulating layer 220 may be formed to cover the region of the graphene layer 130 (the channel region CR) between the source electrode 120a and the drain electrode 120b on the capping layer 210. The gate insulating layer 220 may be formed conformally to the shapes of upper surfaces of the capping layer 210 and the channel region. Thus, a region of the gate insulating layer 220 between the source electrode 120a and the drain electrode 120b may be bent to have a groove. The gate insulating layer 220 may have a thickness of about several nm to several hundreds nm. The gate insulating layer 220 may be formed of a Si oxide, a Si nitride, a Si oxynitride, a high-k material having a dielectric constant higher than the Si nitride, e.g., an Al oxide, an Hf oxide, or a Zr oxide, or an organic material, e.g., polymer. Otherwise, the gate insulating layer 220 may be formed of at least two materials from among these materials. The Si oxide may be formed by, for example, electron-beam evaporation. The Al oxide, the Hf oxide, and the Zr oxide may be formed by, for example, ALD. Otherwise, the Al oxide may be obtained by forming an Al layer by electron-beam evaporation and oxidizing the Al layer. The gate insulating layer 220 may be formed according to any of other various methods.

A gate 230 may be formed on the gate insulating layer 220. The gate 230 may be disposed above the region of the graphene layer 130 between the source electrode 120a and the drain electrode 120b, e.g., the channel region CR. Thus, the gate 230 may be disposed in the bent portion (the groove) of the gate insulating layer 220 between the source electrode 120a and the drain electrode 120b. The gate 230 may have a structure slightly extending to both sides of the bent portion (the groove) of the gate insulating layer 220. The gate 230 may be formed of any of various conductive materials, e.g., metal or a conductive oxide, which are used in a conventional semiconductor device.

Figure 6H:
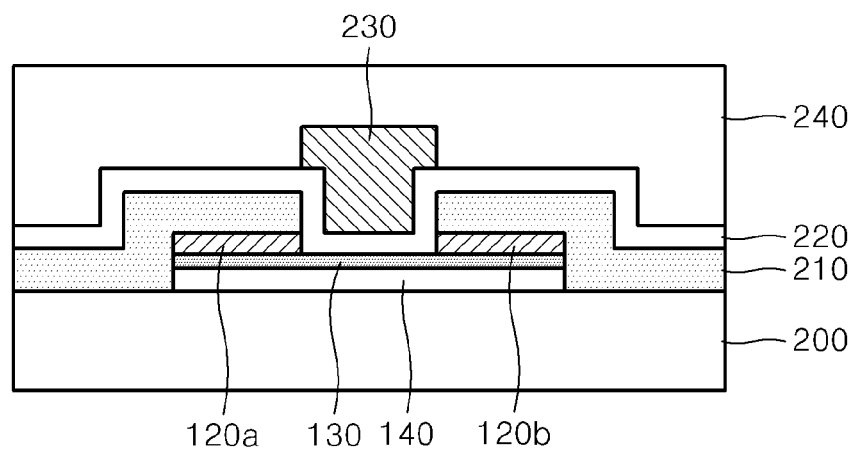

Referring to FIG. 6H, a passivation layer 240 may be formed to cover the gate 230 on the gate insulating layer 220. The passivation layer 240 may be formed of, for example, a Si oxide layer, a Si oxynitride layer, a Si nitride layer, or an organic layer, or may have a stacked structure including at least two layers from among these layers.

Figure 6I:
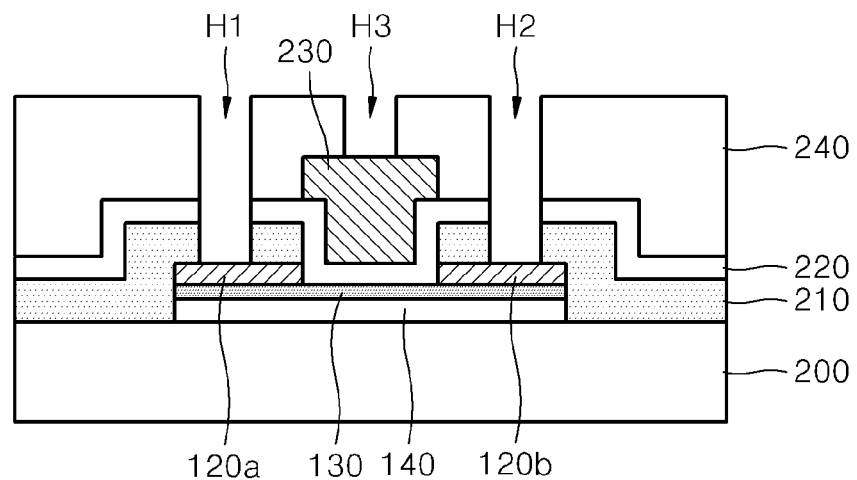

Referring to FIG. 6I, the passivation layer 240, the gate insulating layer 220, and the capping layer 210 may be partially etched to form first to third contact holes H1 to H3. The first and second contact holes H1 and H2 may expose the source electrode 120a and the drain electrode 120b, respectively. The third contact hole H3 may expose the gate 230.

Figure 6J:
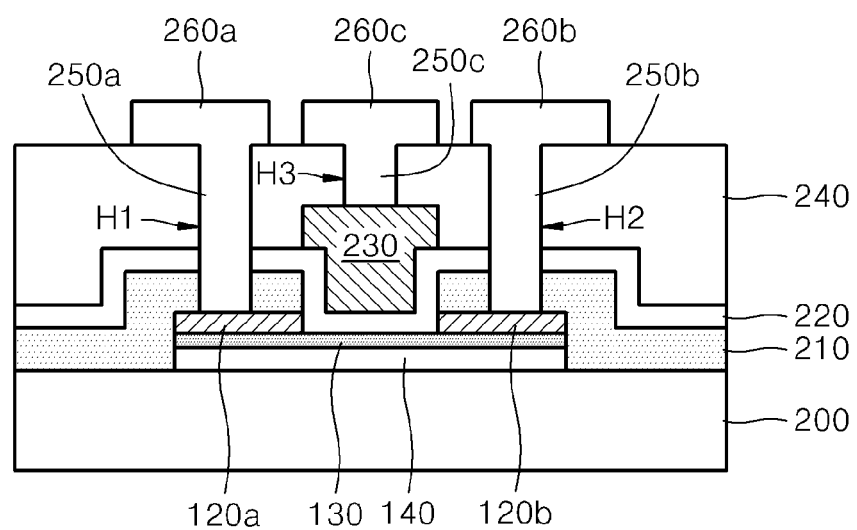

Referring to FIG. 6J, first to third electrode pads 260a to 260c may be formed on the passivation layer 240. The first electrode pad 260a may be formed to be connected to the source electrode 120a via a first contact plug 250a formed in the first contact hole H1. The second electrode pad 260b may be formed to be connected to the drain electrode 120b via a second contact plug 250b formed in the second contact hole H2. The third electrode pad 260c may be formed to be connected to the gate 230 via a third contact plug 250c formed in the third contact hole H3.

Various effects may be obtained by manufacturing a graphene device as described above. In the previous example embodiment, the stacked structure SS1 including the graphene is moved from the first substrate 100 to the second substrate 200 by using bonding and separating/splitting processes. In these processes, the graphene may be prevented or inhibited from being wrinkled or torn and is not likely to be exposed to pollutions. As described above, according to the example embodiment, preventing or reducing damage to or pollution of graphene is possible. Accordingly, manufacturing a high-performance graphene device including high-quality graphene is possible. Also, in the current example embodiment, the source electrode 120a and the drain electrode 120b may be self-aligned with respect to the channel region, and the gate 230 may be self-aligned with respect to the source electrode 120a and the drain electrode 120b. Thus, preventing or suppressing the problems due to misalignment is possible.

Also, since the gate 230, the source electrode 120a, and the drain electrode 120b are disposed above the graphene layer 130 which is used as a channel layer, it is possible to improve the degree of freedom in device design and to prevent or reduce damage to or deformation of the graphene layer 130. Furthermore, in the current example embodiment, the first substrate 100 is separated and/or removed from the stacked structure SS1 by etching the sacrificial layer 110. Thus, the first substrate 100 may be more easily removed, and the separated first substrate 100 may be reused. Also, in the current example embodiment, the capping layer 210 is used to firmly fix the graphene layer 130, the source electrode 120a, and the drain electrode 120b onto the second substrate 200, thereby preventing or inhibiting the graphene layer 130 from peeling off from or being separated from the second substrate 200 and increasing the strength of the graphene device.

Also, since the current example embodiment may require only about five mask processes, a graphene device may be manufactured in a relatively simple manner. In other words, a first mask may be used to form the stacked structure SS1 of FIG. 6A, a second mask may be used to form the source electrode 120a and the drain electrode 120b of FIG. 6F, a third mask may be used to form the gate 230 of FIG. 6G, a fourth mask may be used to form the contact holes H1 to H3 of FIG. 6I, and a fifth mask may be used to form the electrode pads 260a to 260c of FIG. 6J. Thus, according to the current example embodiment, a graphene device may be manufactured in a relatively simple manner.

A method of manufacturing a graphene transistor that uses graphene as a channel layer according to an example embodiment has been described above. However, this method may also be used to manufacture other types of graphene devices. In other words, various types of graphene devices may be manufactured by using the remaining stacked structure SS1c on the second substrate 200 illustrated in FIG. 6D, as a starting structure.

A method of manufacturing a graphene device according to another example embodiment may be performed at a wafer scale, as will be described in detail with reference to FIGS. 12A to 12F below. FIGS. 12A to 12F are perspective views illustrating a method of manufacturing a graphene device, according to another example embodiment.

Figure 12A:
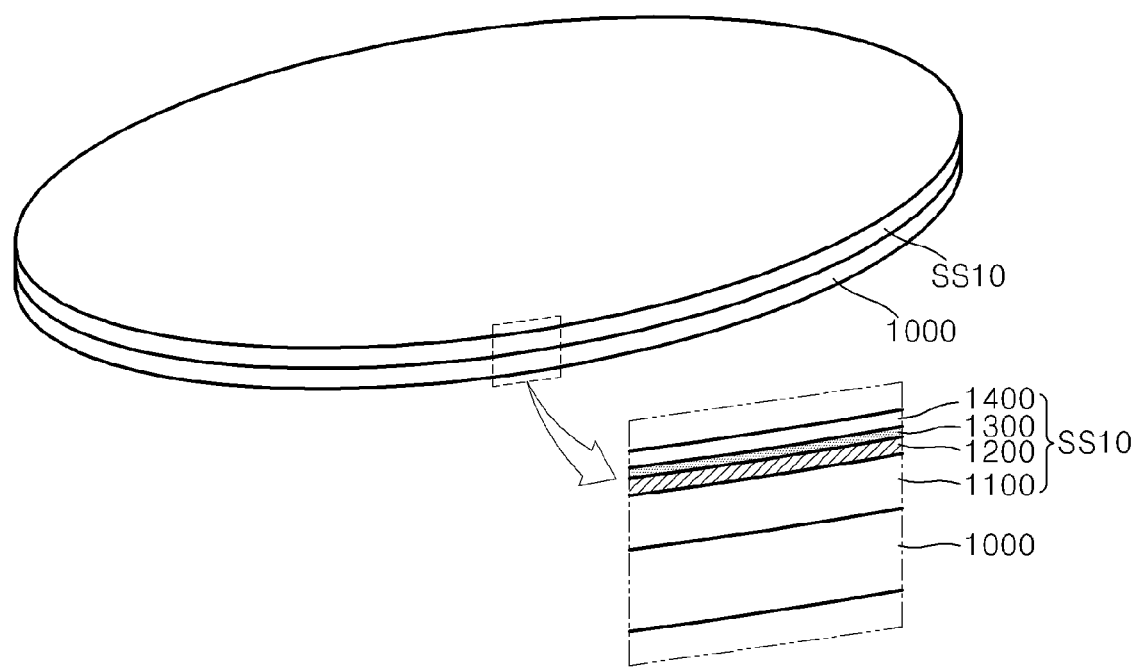
FIGS. 12A to 12F are perspective views illustrating a method of manufacturing a graphene device, according to another example embodiment.

Referring to FIG. 12A, a sacrificial material layer 1100, a catalyst material layer 1200, a graphene material layer 1300, and an insulating material layer 1400 may be sequentially formed on a first substrate 1000. The first substrate 1000 may be a wafer-scale substrate, and the material of the first substrate 1000 may be the same as that of the first substrate 100 of FIG. 6A. Methods and materials used to form the sacrificial material layer 1100, the catalyst material layer 1200, the graphene material layer 1300, and the insulating material layer 1400 may be respectively the same as those used to form the sacrificial layer 110, the catalyst layer 120, the graphene layer 130, and the insulating layer 140 of FIG. 6A. The sacrificial material layer 1100, the catalyst material layer 1200, the graphene material layer 1300, and the insulating material layer 1400 are formed in a film shape, and together form a stacked film SS10.

Figure 12B:
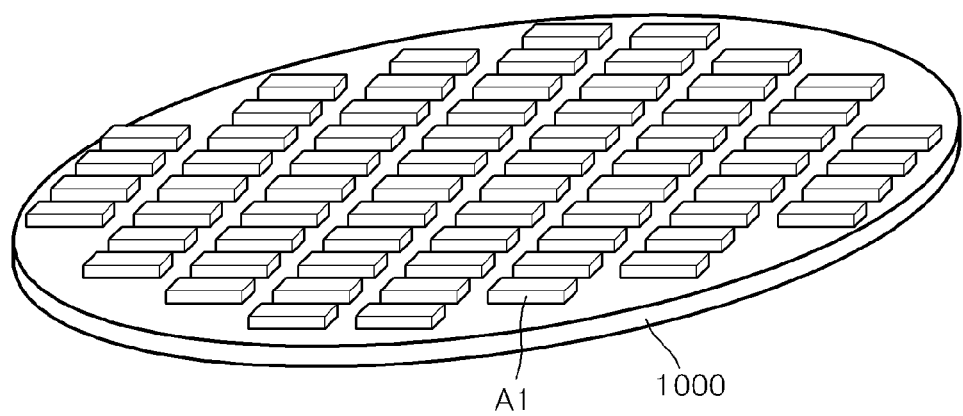

Referring to FIG. 12B, the stacked film SS10 may be patterned to a plurality of active regions A1. The shape of the active regions A1 illustrated in FIG. 12B is just illustrative, and may be modified in various shapes. That is, the active regions A1 may have any one of various planar shapes as illustrated in FIG. 5. Each of the active regions A1 may have a stacked structure corresponding to the stacked structure SS1 of FIG. 6A. The active regions A1 may be formed according to other various methods. In other words, the active regions A1 of FIG. 12B may be formed according to various methods as described above with reference to FIGS. 7A to 10B. Also, although not shown, an alignment key may further be formed on the first substrate 1000 during forming of the active regions A1.

Figure 12C:
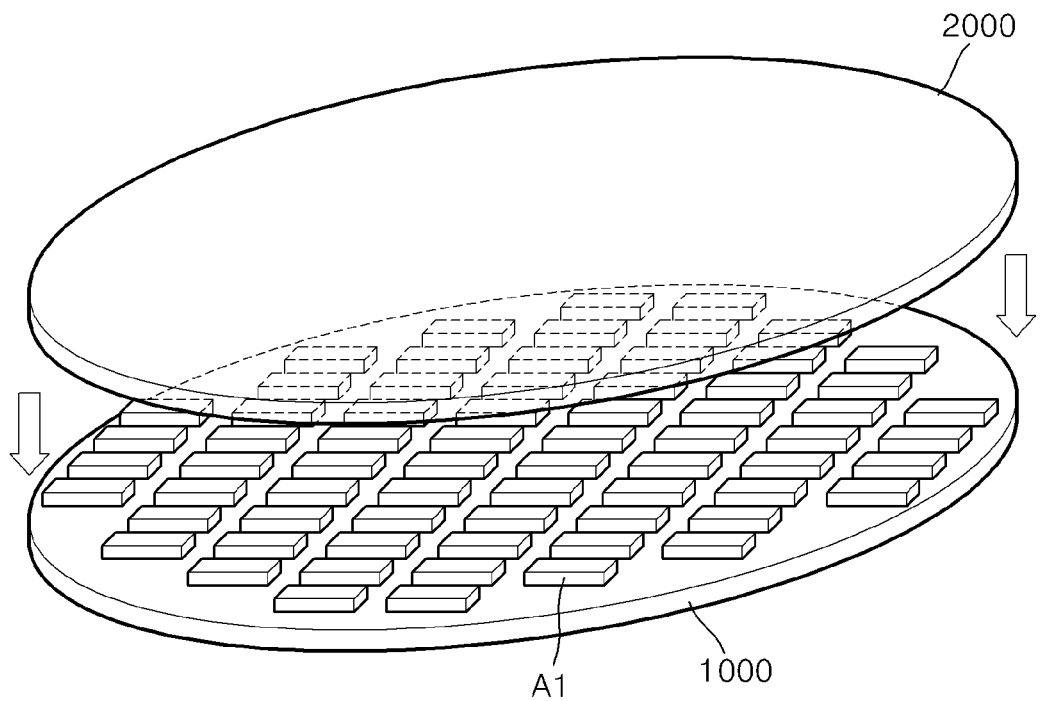
Figure 12D:
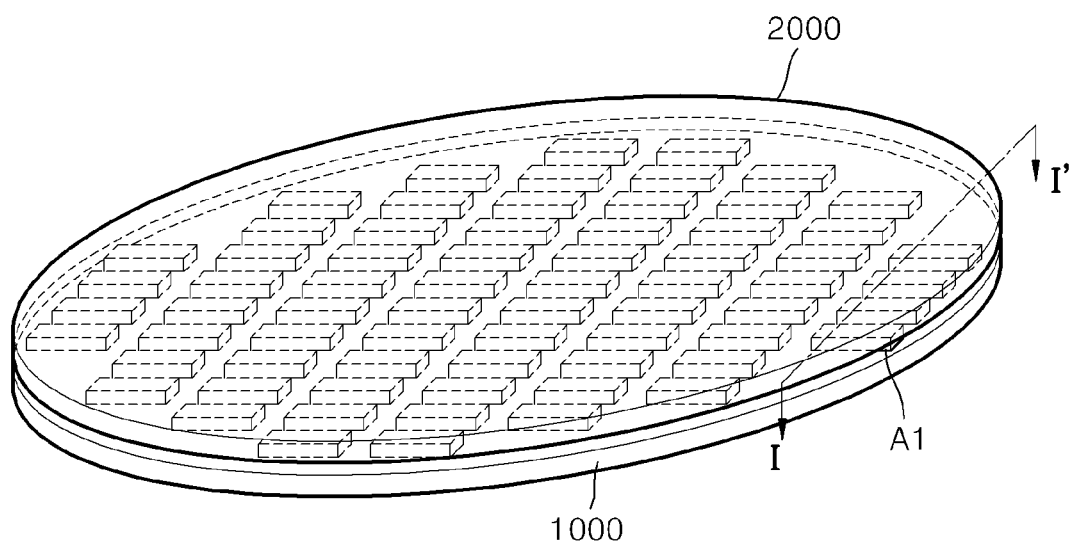

Referring to FIGS. 12C and 12D, a second substrate 2000 may be adhered onto the active regions A1. The second substrate 2000 may be a wafer-scale substrate, and the material of the second substrate 2000 may be the same as that of the second substrate 200 of FIG. 6B. A cross-sectional view taken along a line I-I' of FIG. 12D may be as illustrated in FIG. 13.

Figure 12E:
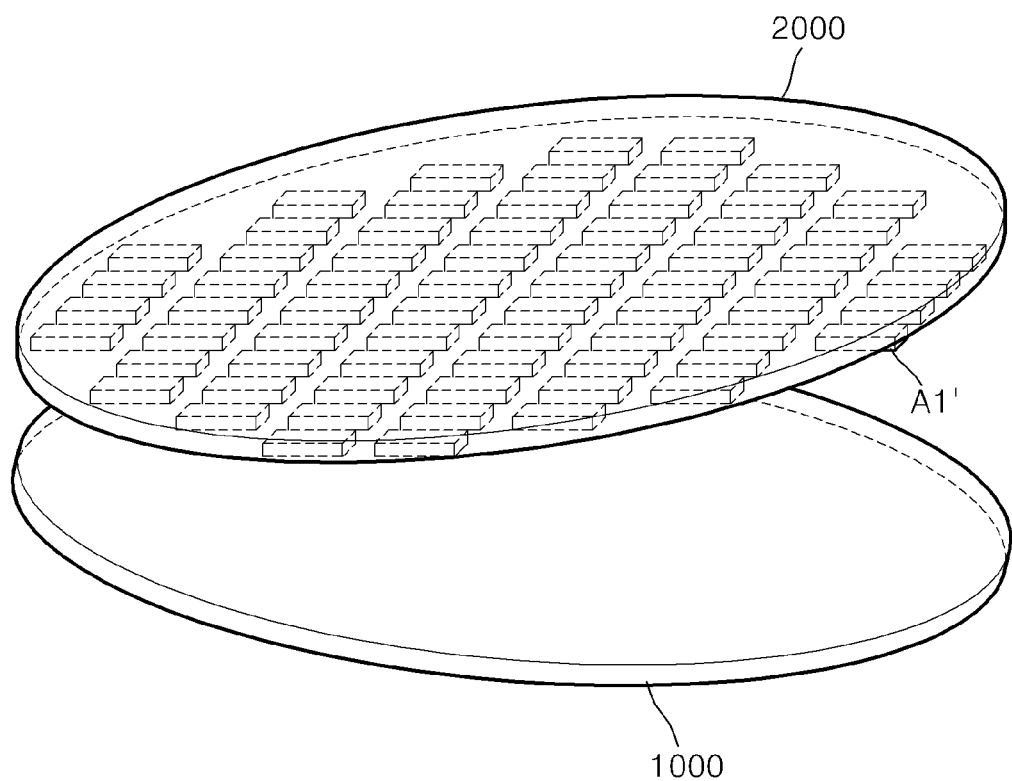

Referring to FIG. 12E, the first substrate 1000 may be separated/removed from the active regions A1 by etching the sacrificial material layer (1100 of FIG. 12A) from the active regions A1. Remaining active regions after removing the sacrificial material layer (1100 of FIG. 12A) from the active regions A1 are marked by A1' in FIG. 12E. To remove the sacrificial material layer (1100 of FIG. 12A), an etching solution may be injected into spaces between the active regions A1. Since the etching solution may be more easily injected between the active regions A1, the sacrificial material layer (1100 of FIG. 12A) may be easily etched. For example, the etching solution may more easily flow into the spaces between the active regions A1 due to capillary force. Thus, even if the first substrate 1000 is a large-size substrate, the sacrificial material layer (1100 of FIG. 12A) may be more easily removed in a relatively short time, and the first substrate 1000 may be more easily removed/separated. The removed/separated first substrate 1000 may be recycled.

Figure 12F:
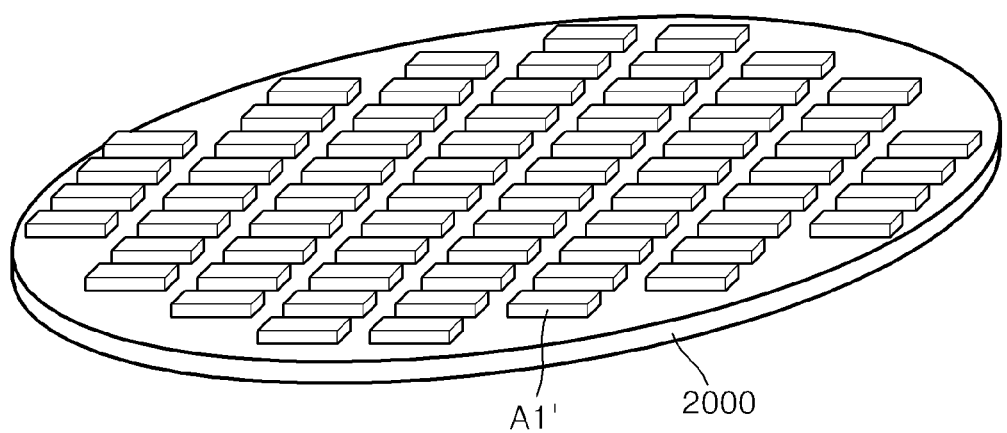

The second substrate 2000 of FIG. 12E may be turned upside down, as illustrated in FIG. 12F. The active regions A1' of FIG. 12F includes the high quality graphene layer (1300 of FIG. 12A) of which the location is controlled. Thereafter, although not shown, a plurality of graphene devices may be manufactured by performing a subsequent process on the active regions A1' on the second substrate 2000 of FIG. 12E. The subsequent process may be similar to, for example, the processes of FIGS. 6E to 6J. As described above, in the current example embodiment, substrate-to-substrate bonding may be used to transfer the active regions A1 from the first substrate 1000 to the second substrate 2000. During the transfer of the active regions A1, a portion of the active regions A1, e.g., the sacrificial material layer 1100, may be etched to separate the first substrate 1000 from the active regions A1. The substrate-to-substrate bonding may be referred to as wafer-to-wafer bonding.

Figure 14A:
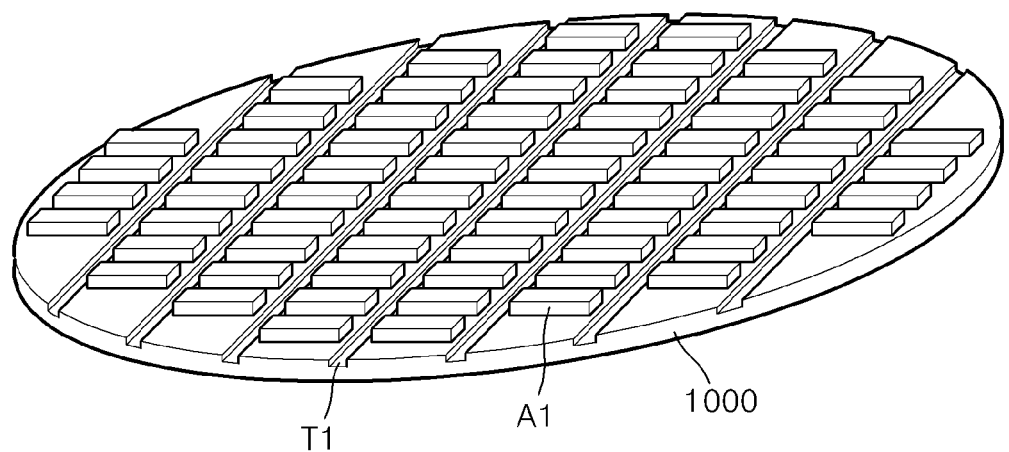
FIGS. 14A and 14B are perspective views illustrating a method of manufacturing a graphene device, according to another example embodiment.
Figure 14B:
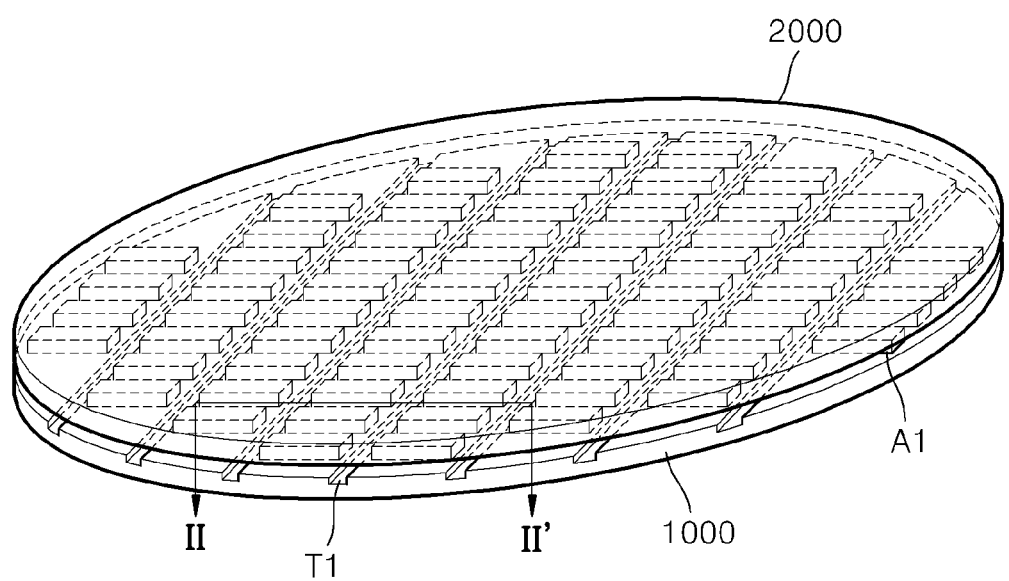

The method of FIGS. 12A to 12F may be modified in various ways. For example, according to another example embodiment, after the active regions A1 are formed on the first substrate 1000 as illustrated in FIG. 12B, at least one trench may be formed in the first substrate 1000, as will be described in detail with reference to FIGS. 14A to 15 below. FIGS. 14A and 14B are perspective views illustrating a method of manufacturing a graphene device, according to another example embodiment.

Referring to FIG. 14A, a plurality of trenches T1 may be formed in a first substrate 1000 with a plurality of active regions A1. If the active regions A1 are arranged in a matrix of rows and columns, then the trenches T1 may be formed between the columns of the active regions A1, but are not limited thereto. Also, a point of time when the trenches T1 are formed may be changed.

Figure 15:
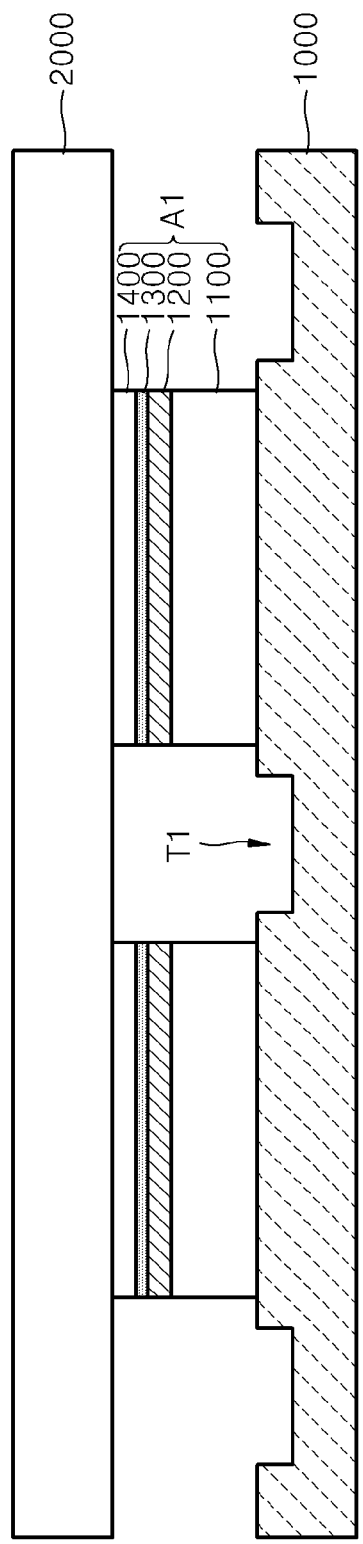
FIG. 15 is a cross-sectional view taken along a line II-II' of FIG. 14B.

Referring to FIG. 14B, a second substrate 2000 may be adhered onto the active regions A1. Then, an etching solution (not shown) may be injected between the first substrate 1000 and the second substrate 2000 to remove the sacrificial material layer (1100 of FIG. 12A) from the active regions A1. The etching solution may be more easily spread over the entire first substrate 1000 via the trenches T1. Thus, if the trenches T1 are formed, the etching solution may more easily flow into the spaces between the active regions A1. A cross-sectional view taken along a line II-II' of FIG. 14B may be as illustrated in FIG. 15.

With the method of FIGS. 12A to 12F or the method of FIGS. 14A and 14B, a method of manufacturing a graphene device according to an example embodiment may be more easily performed even on a large-size substrate (wafer) with a diameter of 300 mm or more. Thus, according to the current example embodiment, increasing productivity of a graphene device while lowering manufacturing costs thereof is possible.

The method of FIGS. 12A to 12F may be modified in various ways. For example, in the operation of FIG. 12B, a plurality of large-size active regions each including a plurality of device regions may be formed instead of forming a plurality of active regions A1 each corresponding to a device region, then the large-size active regions may be transferred to a second substrate and divided into a plurality of small-size active regions. In other words, each of the active regions A1 of FIG. 12B may correspond to one of a plurality of devices but may include a plurality of device regions. In the latter case, each of the active regions A1 may be divided into a plurality of sub regions.

In addition, the graphene device according to an example embodiment may be applied to various types of substrates. That is, in the graphene device, various substrates may be used as the second substrate 200 or 2000. Thus, the graphene device may be effectively used for various purposes, and may have relatively wide application in a variety of fields. For example, an example embodiment may be applied to the field of flexible display when a flexible substrate is used as the second substrate 200, and may be applied to the field of transparent display when a transparent substrate, e.g., a glass substrate, is used as the second substrate 200. Also, the graphene device according to an example embodiment may be applied to not only the field of display but also various fields, e.g., the field of radio-frequency (RF) device.

It should be understood that the example embodiments described therein should be considered in a descriptive sense only and not for purposes of limitation. For example, it will be obvious to those of ordinary skill in the art that the graphene devices and methods of manufacturing the same according to the previous embodiments may be modified in various ways. Also, an example embodiment may be applied to not only a graphene transistor but also other types of graphene devices. It will be understood by those of ordinary skill in the art that various changes in form and details may be made without departing from the spirit and scope of the appended claims.

What is claimed is:

1. A graphene device comprising:
   a channel layer on a substrate, the channel layer including graphene;
   a source electrode on a first region of the channel layer;
   a drain electrode on a second region of the channel layer;
   a capping layer covering the channel layer, the source electrode, and the drain electrode, the capping layer being formed of an insulating material, the capping layer including an opening exposing a channel region of the channel layer between the source electrode and the drain electrode;
   a gate insulating layer on the capping layer to cover the channel region; and
   a gate on the gate insulating layer between the source electrode and the drain electrode.

2. The graphene device of claim 1, further comprising:
   an insulating layer between the substrate and the channel layer.

3. The graphene device of claim 2, wherein the insulating layer is a patterned layer having a same shape as the channel layer.

4. The graphene device of claim 2, wherein the capping layer directly contacts a side surface of the insulating layer.

5. The graphene device of claim 1, wherein the source electrode and the drain electrode are formed of a catalyst material for growing graphene.

6. The graphene device of claim 1, further comprising:
   a passivation layer on the gate insulating layer to cover the gate.

7. The graphene device of claim 6, further comprising:
   first, second and third electrode pads on the passivation layer,
   wherein the first electrode pad is connected to the source electrode, the second electrode pad is connected to the drain electrode, and the third electrode pad is connected to the gate.

8. The graphene device of claim 1, wherein the substrate includes at least one of a plastic substrate, a glass substrate, and a silicon substrate.

9. The graphene device of claim 1, wherein the capping layer directly contacts a side surface of the source electrode and the drain electrode.

10. The graphene device of claim 1, wherein the capping layer directly contacts a side surface of the channel layer.

11. A graphene device comprising:
    a channel layer on a substrate, the channel layer including graphene;
    a source electrode on a first region of the channel layer;
    a drain electrode on a second region of the channel layer;
    a capping layer covering the channel layer, the source electrode, and the drain electrode, the capping layer including an opening exposing a channel region of the channel layer between the source electrode and the drain electrode;

a gate insulating layer on the capping layer to cover the channel region; and a gate on the gate insulating layer between the source electrode and the drain electrode, wherein the capping layer directly contacts side surfaces of the source electrode, the drain electrode and the channel layer.

* * * * *